(12) United States Patent
Cheng et al.

(10) Patent No.: US 6,500,770 B1
(45) Date of Patent: Dec. 31, 2002

(54) METHOD FOR FORMING A MULTI-LAYER PROTECTIVE COATING OVER POROUS LOW-K MATERIAL

(75) Inventors: Yu-Huei Cheng, Hsin-Chu (TW); Chen-Hua Yu, Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 10/127,371

(22) Filed: Apr. 22, 2002

(51) Int. Cl.[7] ................ H01L 21/31; H01L 21/469
(52) U.S. Cl. ................ 438/782; 438/778; 438/781
(58) Field of Search ................ 438/758, 778, 438/781, 782, 787

(56) References Cited

U.S. PATENT DOCUMENTS

| | | | | |
|---|---|---|---|---|
| 4,613,544 A | * | 9/1986 | Burleigh | 428/315.5 |
| 5,364,818 A | * | 11/1994 | Ouellet | 437/195 |
| 5,457,073 A | * | 10/1995 | Ouellet | 437/231 |
| 6,123,986 A | * | 9/2000 | Maschwitz et al. | 427/162 |
| 6,319,858 B1 | * | 11/2001 | Lee et al. | 438/787 |
| 6,383,951 B1 | * | 5/2002 | Li | 438/781 |

* cited by examiner

*Primary Examiner*—Alexander Ghyka
(74) *Attorney, Agent, or Firm*—Tung & Associates

(57) ABSTRACT

A method for forming a multi-layer protective coating over a porous low-k (dielectric constant) material for use in a multiple layer semiconductor device including providing a semiconductor process wafer including a process surface said process surface including an uppermost surface of a low-k porous material layer said low-k porous material layer including a plurality of openings penetrating the process surface; and, spin coating a flowable dielectric onto the process surface to form a plurality of protective sealing layers such that the porosity of the low-k porous material layer is substantially maintained and the plurality of protective sealing layers are formed such that the migration of water ($H_2O$) is substantially blocked through at least an uppermost protective sealing layer surface.

20 Claims, 1 Drawing Sheet

METHOD FOR FORMING A MULTI-LAYER PROTECTIVE COATING OVER POROUS LOW-K MATERIAL

FIELD OF THE INVENTION

This invention generally relates to semiconductor device manufacturing methods and more particularly to methods for forming a multi-layer protective coating including a plurality of protective sealing layers over low-k (dielectric constant) porous insulating material to prevent migration of chemical species including water ($H_2O$).

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been signal delay caused by parasitic capacitive effects of insulating materials in which metal interconnects are formed to interconnect devices. It has become necessary to reduce capacitance of the insulating layers to allow the insulating layer thicknesses to shrink along with other device features such as metal interconnect line width. As a result, the need for lower dielectric constant materials has resulted in the development of several different types of organic and inorganic low-k materials.

Manufacturing processes such as, for example, damascene processes, have been implemented to form metallization vias and interconnect lines (trench lines) by dispensing entirely with the metal etching process. The damascene process is a well known semiconductor fabrication method for forming multiple layers of metallization vias and interconnect lines (trench lines). For example, in the dual damascene process, a trench opening and via opening is etched in an insulating layer also known as an inter-metal or inter-level dielectric (IMD/ILD) layer. The insulating layer is typically formed over a substrate including another conductive area over which the vias and trench lines are formed and in communication with. After a series of photolithographic steps defining via openings and trench openings, via and the trench openings are filled with a metal, preferably copper, to form metallization vias and interconnect lines (trench lines), respectively. The excess metal above the trench line level is then removed by well known chemical-mechanical planarization (polishing) (CMP) processes.

As indicated, advances in semiconductor device processing technology demands the increasing use of low-k (low dielectric constant) insulating materials in, for example, IMD (ILD) layers that make up the bulk of a multilayer device. In order to reduce signal delays caused by parasitic effects related to the capacitance of insulating layers, for example, IMD layers, incorporation of low-k materials has become standard practice as semiconductor feature sizes have diminished. Many of the low-k materials are designed with a high degree of porosity to allow the achievement of lower dielectric constants. Several different organic and inorganic low-k materials have been developed and proposed for use in semiconductor devices as insulating material having dielectric constants less than about 3.0 for achieving integration of, for example, 0.13 micron interconnections. In the future, even lower dielectric constant material, for example less than about 2.5, will be required for 0.1 micron process integration, and dielectric constants of less than about 2.0 will be required for 0.07 micron process integration.

One exemplary low-k inorganic material that is frequently used, for example, is carbon doped silicon dioxide (C-oxide) formed by a CVD process where the dielectric constant may be varied over a range depending on the process conditions. C-oxide, for example, may be formed with dielectric constants over a range of about 2.0 to about 3.0 and density of about 1.3 $g/cm^3$ compared to dielectric constants of about 4.1 and a density of about 2.3 $g/cm^3$ for silicon dioxides (e.g., un-doped TEOS). Other exemplary low-k inorganic materials include porous oxides, xerogels, or SOG (spin-on glass). Exemplary low-k organic materials include polysilsequioxane, parylene, polyimide, benzocyclobutene and amorphous Teflon.

Low-k materials believed to be required to achieve integration of 0.07 micron devices will require low-k materials (ultra low-k) with a dielectric constant of less than about 2.0. Such low-k materials will typically require a porosity of 50 per cent to 80 percent by volume. An exemplary class of materials able to achieve this level of porosity includes porous silica films. Porous silica films are generally formed with a porosity of about 20% or greater and with pore sizes that range from about 1 nm to about 100 nm. The density of the silicon containing composition, including the pores, ranges from about 0.1 to about 1.9 $g/cm^3$. Yet another material that has received recent attention for use as an ultra low-k material in semiconductor devices are mesoporous silicates, such as molecular sieve materials, that have a well determined pore structure with a narrow size distribution, such as a honeycomb structure including repeating units of cage-like pores. Examples of molecular sieves having, for example, a channel-typed micropore structure include TSM and silicalate. Mesoporous materials have a pore size from about 10 to about 500 Angstroms. These materials may have porosities from about 50 percent to about 80 percent and can have dielectric constants of less than about 2.0. One advantage of these materials is their relatively high strength due to their crystalline nature. Yet another class of ultra low-k materials includes aerogels. Aerogels are generally created by acid catalyzed hydrolysis of precursors such as tetraethylorthosilicate (TEOS) and tetramethylorthosilicate (TMOS) under controlled atmosphere conditions including and aging and drying period.

As might be expected, the development of porous low-k materials has presented several problems in manufacturing methods that must be overcome such as material strength and tendency to absorb chemical species such as water. One important limitation of porous low-k materials is low strength tendency to crack or peel in subsequent manufacturing processes including, for example, chemical mechanical planarization (CMP). In order to protect the porous low-k insulating material layers, it has been necessary to add a capping layer over the porous low-k insulating layer including for example, silicon nitride (SiN) and silicon oxynitride (SiON). Additionally, silicon carbide (SiC) has been used as a capping layer to protect the insulating layer in subsequent processing steps including CMP.

One problem with the prior art capping layer technology is that due to the high porosity present in low-k insulating materials, is that adhesion of the capping layers of the prior art is poor and undesirably add to the overall dielectric constant of the multi-layer device. For example, SiC has a dielectric constant of about 5.0 and the metal nitrides such as SiN and SiON have dielectric constants greater than 5.0. Capping layers are necessary, however, to protect the increasingly porous low-k materials have proven necessary to both protect the low-k material during subsequent processing steps including CMP, and to prevent the porous low-k material from absorbing moisture.

Many of the porous low-k and ultra low-k materials including mesoporous and nanoporous structures include an interconnecting pore structure that allows chemical species, such as water ($H_2O$), to readily migrate through the low-k material presenting serious problems in subsequent processing steps. Thus, for example, during an RIE etching step in an oxygen containing plasma to remove the photoresist used to pattern via openings or trench openings, the low-k material produces hydrophilic bonds and absorbs moisture. During subsequent metal deposition to fill via holes and trench openings to form metal interconnects, outgassing of the moisture occurs, causing oxidation of metal contacts resulting in via poisoning, or high resistivity of the via interconnect due to the oxidized metal contacts or interconnects. A further problem with water absorption on hydrophilic surfaces, such as nanoporous or mesoporous silica material, is that the absorption of water tends to significantly increase the dielectric constant of the porous silica material due to the high internal surface area of the material and consequently the large amount of water that may be absorbed. For example, a porous material with a dielectric constant of less than about 2 and a porosity of about 50 to 80 percent by volume can absorb enough water to raise the dielectric constant to about 4.0.

Another problem with migrating chemical species in porous low-k materials, concerns amine and other nitrogen-containing hydrophilic species originating from, for example, metal nitride layer forming CVD processes that may readily diffuse into an underlying or overlying porous low-k insulating layer. The nitrogen containing species are believed to later diffuse out to interfere with a subsequent photolithographic exposure and development process using acid generated photoresists, such photoresist used, for example, in many deep ultraviolet (DUV) photolithographic patterning processes. The contaminating nitrogen-containing is believed to diffuse out of the low-k insulating layer during a subsequent photoresist process interfering with the photoresist development process thereby altering resist profiles by having undeveloped photoresist remain deposited on feature edges and sidewalls.

The prior art has attempted to solve this problem by employing several different types of chemical surface hydrophobic modifying agents designed to cap the exposed silanol (hydrophilic) species on the internal surface area of the porous material to prevent absorption and migration of hydrophilic species. One problem with this approach is that the surface modifying agents tend to decrease the porosity of the material and therefore raise the dielectric constant as they penetrate into the interconnecting pore structure of the material to react with exposed surface silanol species.

It would therefore be advantageous to develop a method for forming a protective layer over a low-k porous insulating material layer in a multiple layer semiconductor device that is able to preserve the porosity and therefore dielectric constant of the porous low-k material while sealing the porous material to the migration of chemical species, including water ($H_2O$) into the low-k porous insulating material layer.

It is therefore an object of the invention to present a method for forming a protective layer over a low-k porous insulating material layer in a multiple layer semiconductor device that is able to preserve the porosity and therefore dielectric constant of the porous low-k material while sealing the porous material to the migration of chemical species, including water ($H_2O$) into the low-k porous insulating material layer.

SUMMARY OF THE INVENTION

To achieve the foregoing and other objects, and in accordance with the purposes of the present invention, as embodied and broadly described herein, the present invention provides a method for forming a multi-layer protective coating over a porous low-k (dielectric constant) material for use in a multiple layer semiconductor device.

In a first embodiment, the method includes the steps of providing a semiconductor process wafer including providing a semiconductor process wafer including a process surface said process surface including an uppermost surface of a low-k porous material layer said low-k porous material layer including a plurality of openings penetrating the process surface to form a plurality of pore openings; and spin coating a flowable dielectric onto the process surface to form a plurality of protective layers such that the porosity of the low-k porous material layer is substantially maintained and the plurality of protective layers are formed such that migration of water ($H_2O$) is substantially blocked through at least an uppermost protective layer surface.

In another embodiment, the step of spin coating further includes forming an initial protective layer over the process surface to at least partially cover the plurality of pore openings thereby forming a corresponding narrowed communication channel to include a closed communication channel disposed substantially over each pore opening of the plurality of pore openings to form a plurality of communication channels; forming at least one additional protective layer over the initial protective layer to at least narrow the plurality of communication channels to a diameter of less than about 5 Angstroms to include closing at least a portion of the plurality of communication channels.

In a related embodiment, the low-k porous material layer includes interconnecting pores having a pore diameter of from about 10 Angstroms to about 500 Angstroms. In other related embodiments, the low-k porous material layer has a dielectric constant of less than about 3.0. Further the low-k porous material layer has a dielectric constant of less than about 2.0.

In other embodiments, the low-k porous material layer includes at least one of a porous silica, a mesoporous silicate, an aerogel, or a xerogel. Further, the low-k porous material layer includes a mesoporous material with a dimensionally consistent pore structure. Further yet, the flowable dielectric forms a silicon oxide containing material. Yet further, the plurality of protective layers have a density of from about 2.2 to about 2.4 gms/cm$^3$.

In yet another embodiment, the plurality of protective layers are impermeable to water. Further, the plurality of protective layers are formed having a total thickness of less than about 1000 Angstroms. In a related embodiment, the plurality of protective layers are formed having substantially the same thickness. Further, each protective layer of the plurality of protective layers is formed having a sequentially decreasing thickness from an initial protective layer thickness.

In another embodiment, the step of spin coating further includes dispensing a selectable amount of flowable dielectric onto the process wafer surface while spinning the process wafer to form a substantially uniform layer of the flowable dielectric; spin drying the substantially uniform layer of flowable dielectric by spinning the process wafer for a period of time sufficient to form an at least partially polymerized protective layer over the process wafer surface including at least a portion of the pore openings; repeating the dispensing and spin drying steps to form a plurality of the at least partially polymerized protective layers; baking the plurality of the at least partially polymerized protective layers at a temperature for a period of time; and, curing the plurality of the at least partially polymerized protective layers at a temperature for a period of time to form a plurality of substantially polymerized protective layers.

In related embodiments, the step of dispensing further comprises spinning the process wafer at a spin rate of from about 1000 to about 4000 rpm. Further, the step of spin drying further comprises spinning the process wafer at a spin rate of from about 2000 to about 4000 rpm. Further yet, the step of baking further comprises heating the process wafer at one or more temperatures ranging from about 50 to about 300 degrees Centigrade for a total heating period of from about 1 minute to about 10 minutes. Yet further, the step of curing further comprises heating the process wafer at one or more temperatures ranging from about 200 to about 500 degrees Centigrade for a total heating period of from about 5 minutes to about 20 minutes.

In another embodiment, at least one of the steps of dispensing, baking and curing are selectively carried out under controlled ambient conditions including a pressure.

In yet another embodiment, an outgassing step is performed to outgas moisture from the low-k porous material layer prior to forming a protective layer included in the plurality of protective layers such that water ($H_2O$) is substantially blocked from migrating through the at least an uppermost protective sealing layer surface.

These and other embodiments, aspects and features of the invention will be better understood from a detailed description of the preferred embodiments of the invention which are further described below in conjunction with the accompanying FIGS.

DETAILED DESCRIPTION OF THE PREFERRED EMBODIMENTS

The method according to the present invention is explained with reference to exemplary portions of an exemplary process used in creating a multiple layer semiconductor device but should be understood to apply to the manufacture of any semiconductor device or feature where it would be advantageous to form a plurality of protective sealing layers such that the porosity of the low-k porous material layer is substantially maintained and the plurality of protective sealing layers are formed such that the migration of water ($H_2O$) is substantially blocked through at least an uppermost protective sealing layer surface.

By the term porous as used herein is meant pores including an interconnecting porosity and including a pore size or interconnecting channel size of from about 10 Angstroms to about 500 Angstroms. Although the method of the present invention is described with respect to an exemplary mesoporous insulating silica material (silicate) with a well-defined repeating pore structure for clarity, it will be understood that the method of the present invention may be applied to any porous material where it would be advantageous to provide a plurality of protective sealing layers over a porous low-k insulating layer to block migration of chemical species including water into the porous low-k insulating layer.

Figure 1:
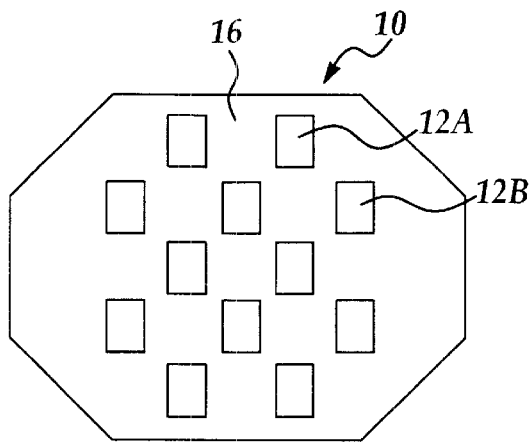
FIG. 1 is a schematic representation of a top view of pore openings in an exemplary low-k mesoporous material according to the present invention.

The method of the present invention is more clearly described by referring to FIG. 1 which shows an exemplary porous structure where the method of the present invention is advantageously applied. In FIG. 1, is shown a portion of a cross sectional top view of a mesoporous silicate material with a dimensionally consistent rod-shaped pore structure. The mesoporous silicate is formed by well known methods generally including combining a metal oxide, such as silicon dioxide precursor, and a small organic moiety, having at least one head group, under conditions which are suitable for causing the formation of a complex between the head group of the small organic moiety and the metal oxide precursor. The complex is then hydrolyzed and the reaction mixture is aged for a period of time and at a temperature suitable for causing the formation of the crystalline porous metal oxide having a dimensionally consistent pore structure. The small organic moiety can be removed from the crystalline porous metal oxide by washing or by calcination, resulting in the crystalline porous metal oxide having a dimensionally consistent pore structure (regularly repeating).

A "mesoporous" is a structure with a regular array of channels having a substantially uniform diameter or "pore" size ranging from about 10 Angstroms to about 500 Angstroms, preferably from about 20 Angstroms to about 200 Angstroms, more preferably from about 20 Angstroms to about 50 Angstroms. A "dimensionally consistent pore structure," as used herein, means a pore structure throughout the composition which is uniform in pore size to plus or minus 10 percent of the pore diameter with the pores including anisotropic channels with minimal interconnecting between channels.

For example in FIG. 1, a mesoporous silicate material 10 with a hexagonally packed mesoporous structure, similar in structure to a honeycomb, is shown with rod shaped pores (channels) at e.g., 12A and 12B. The channel formed by the crystalline packing of the microporous structure is a hollow tube. The porosity of the mesoporous material is for example, for about 50 to about 80 percent by volume. An exemplary channel size of channels, e.g., 12A and 12B is about 30 Angstroms. The bulk of the structure, preferably a silicate, e.g., 16 has good strength with, for example, a Young's modulus of about 16 GPa. Further, the bulk of the material, for example, at 16, of the mesoporous material is preferably a silicate, such as silicon oxide including silicon dioxide, having a dielectric constant of less than about 2.0, more preferably about 1.5. The silicate mesoporous material is used in the exemplary semiconductor device as an insulating layer also known as an intermetal dielectric layer or intermetal dielectric (IMD/ILD) in the exemplary embodiments of the plurality of protective sealing layers according to the present invention.

Although the present invention is explained by reference to a portion of a dual damascene process it will be appreciated that the method according to the present invention for forming a multi-layer protective coating over a porous low-k insulating material is not limited to a dual damascene or damascene process and that the present invention applies to any semiconductor feature manufacturing process where providing a plurality of protective layers over a porous low-k insulating material would be advantageous with the additional benefit of a lower dielectric constant relative to protective layers according to the prior art.

Further, although in making exemplary reference to a damascene process by referring only to a single layer process it will be appreciated that the single layer process may be repeated in multiple layers for forming a multiple layer semiconductor device.

As used herein, the term 'low-k' means a dielectric constant of less than about 3.0. In addition, the term 'about' as used herein refers to a value within about 10 percent of the stated value. The term 'substantially' means the stated effect or result to within about 90 percent of a measurable determination of the effect or result.

There are several techniques for manufacturing damascene structures including a dual damascene process such as via first fabrication, self-aligned fabrication, and trench first fabrication. Generally, in a typical dual damascene manufacturing process, for example, conventional photolithographic processes using a photoresist layer is first used to expose and pattern an etching mask on the surface of a hard mask layer overlying a low-k insulating (IMD/ILD) layer, for etching trench openings through the low-k insulating layer. Subsequently a similar process is used to define via openings that are formed within the trench openings which in turn define metallization vias that are formed through another a second insulating layer. The via openings and trench openings are subsequently filled with metal, preferably copper, to form vias and trench lines (metal interconnect lines). The surface may then be planarized by conventional techniques such as chemical mechanical planarization (CMP) to remove excess metal and better define the trench lines and prepare the multilayer device for further processing.

Figure 2A:
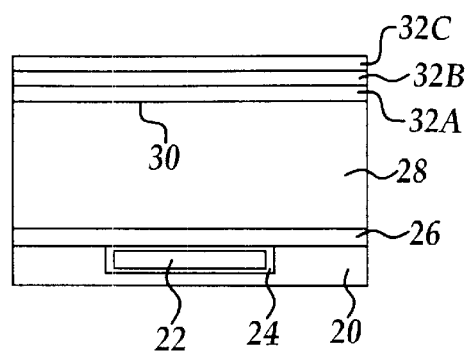
FIGS. 2A–2C are cross sectional side view representations of a portion of a multi-layer semiconductor device at a stage in manufacture including embodiments of a multi-layer protective coating according to the present invention.

Referring to FIG. 2A, a portion of a damascene process using, for example, a low-k mesoporous silicate insulating material for an IMD layer 28, is depicted in a cross sectional side view representation. A substrate 20, for example an insulating material having a conductive area 22 is provided including, for example a copper filled trench line. The conductive area 22 may include a barrier layer 24 lining the trench such as tantalum nitride (TaN) to protect the insulating layer from diffusion of copper from the trench line. Next, an etching stop layer 26 is provided over the substrate, for example silicon nitride (SiN), silicon oxynitride (SiON), or silicon carbide (SiC), to act as an etching stop in a subsequent operation where via openings are etched through an overlying porous low-k insulating layer to form closed communication with the conductive area 22. The etching stop layer is typically deposited by chemical vapor deposition using for example, PECVD, or high density plasma CVD (HDP-CVD).

Following deposition of the etching stop layer 26 a low-k porous insulating layer 28, for example, a low-k mesoporous silicate insulating material is deposited to the desired thickness of, for example, via openings, from about 4000 Angstroms to about 5000 Angstroms. It will be appreciated that 2 porous low-k insulating layers may be used in a typical dual damascene process, a via insulating layer, e.g., 28 for forming vias therein and a trench line insulating layer (not shown) for forming the trench lines therein. In the exemplary application of the present invention as explained, only that portion of the process forming the via insulating layer, e.g., 28, is shown including a plurality of protective layers according to the present invention. It will be appreciated however, that the plurality of protective layers according to the present invention may additionally be included to protect additional or different low-k porous insulating layers in a multilayer structure including an overlying trench line insulating layer.

Referring again to FIG. 2A, following deposition of the etching stop layer 26, via insulating layer 28 is deposited with a thickness of about 4000 to about 5000 Angstroms. The via insulating layer is preferably a low-k porous insulating material, preferably with a dielectric constant of less than about 2, for example, the mesoporous silicate material previously discussed. The mesoporous silicate material is preferably applied by a spin coating method followed by an aging period and calcination to remove an organic template according to conventional methods.

According to the present invention, following deposition of the low-k porous insulating layer 28, a plurality of protective layers e.g., 32A, 32B, and 32C are applied over the low-k porous insulating layer 28 to provide a multi-layer protective coating, whereby the pores included in the low-k porous insulating layer 28 penetrating the uppermost insulating layer surface 30 to create pore openings (not shown-see FIG. 3), are either substantially closed by an overlying protective layer e.g., 32A, 32B, or 32C, or in communication with openings formed substantially over the pore openings in the overlying protective layer to form communication channels (not shown-see FIG. 3). The communication channels in each successive protective sealing layer in the plurality of protective sealing layers are progressively narrowed with each successive protective layer to include substantially closing the channel with minimal filling of the pore openings to substantially maintain the porosity in the porous low-k insulating layer 28, for example, a mesoporous silicate material.

In one embodiment of the present invention, still referring to FIG. 2A, a plurality of protective layers e.g., 32A, 32B and 32C using a spin on dielectric (SOD) or spin on glass (SOG) are applied over the surface 30 of porous insulating layer 28. It will be appreciated that 2 or more layers are applied to form the plurality of protective sealing layers, the number of protective sealing layers depending in part on the size of the pore openings (see e.g., FIG. 3) desired to be substantially sealed to water migration at the surface 30 of porous insulating layer 28. In an exemplary embodiment, for example, the mesoporous silicate material used for insulating layer 28 has a pore openings including a corresponding channel size of about 30 Angstroms. In an exemplary embodiment, the mesoporous silicate material has a uniform pore size distribution with a deviation of plus or minus about 3 Angstroms. Preferably, according to an exemplary embodiment, the plurality of protective layers e.g., 32A, 32B, and 32C are formed to have a total thickness of less than about 1000 Angstroms.

Figure 2B:
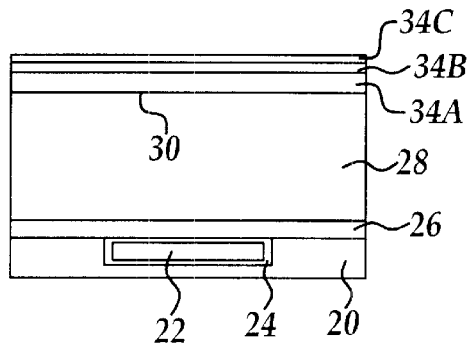
Figure 2C:
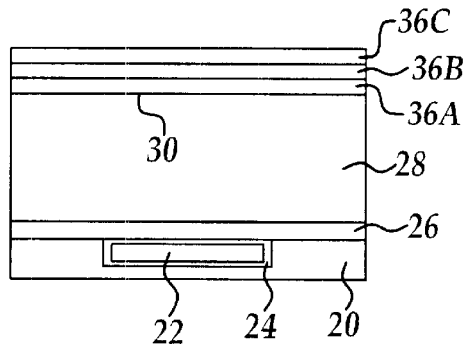

Referring to FIG. 2B, in another embodiment, for example, the plurality of protective layers may be applied with decreasing sequential thickness, of e.g., 500 Angstrom, 200 Angstroms and 100 Angstroms for protective layers 34A, 34B, and 34C, respectively, for a total thickness of 800 Angstroms. In another embodiment, referring to FIG. 2C the plurality of protective layers may be applied with about the same thickness, for example 200 Angstroms for each protective layer e.g., 36A, 36B, and 36C. Again, as further explained below, the desirability of applying the plurality of protective layers with decreasing thickness or about the same thickness, including the number of protective layers to be applied will depend in part on the size of the pores in low-k porous insulating layer 28 penetrating the insulating layer surface 30 to form pore openings. Larger pores, for example, greater than about 100 Angstroms will require more protective layers to progressively narrow the communication channels formed in each protective layer to a sufficient degree to block migration of water. Preferably, when a greater number of protective sealing layers is required to narrow the protective layer communication channels to a sufficient degree, preferably 5 Angstroms or less, to block water migration, the protective layers are applied with decreasing thickness to minimize the overall contribution to capacitance by the plurality of protective layers.

Figure 3A:
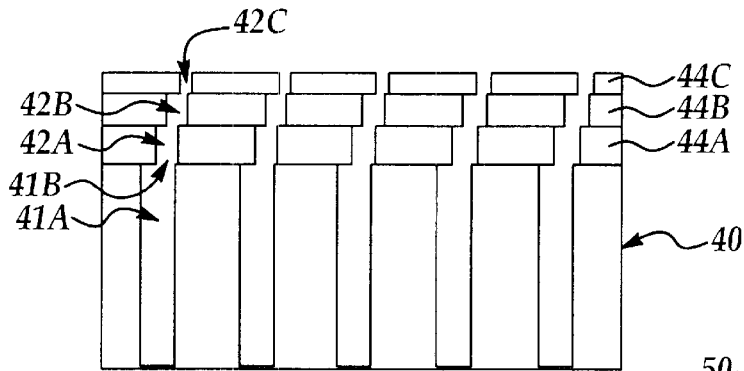
FIG. 3A is a conceptual cross-sectional side view representation of an exemplary low-k porous material layer including protective layers according to the present invention.

For example, in operation, referring to FIG. 3A a conceptual expanded cross-sectional side view representation of an exemplary low-k mesoporous silicate material layer 40 including a plurality of protective layers is shown depicting the mesoporous pores (channels) e.g., 41A, and illustrating the progressive narrowing of the protective layer communication channels e.g. 42A, 42B, and 42C in communication with pore opening 41B, with each successive protective layer e.g., 44A, 44B, and 44C. It will be appreciated that while it is preferable that the communication channels, e.g., 42C be completely sealed, that it is sufficient according to the present invention that the communication channels in the uppermost protective layer, e.g., 42C, in communication with pore openings e.g., 41B be narrowed to a diameter of less than about 5 Angstroms. For example, water ($H_2O$) requires an opening size of about 5 Angstroms or greater to migrate along the communication channels to penetrate into the porous low-k insulating layer 40.

The flowable dielectric including spin on glass (SOG) or spin on dielectric (SOD) according to the present invention is preferably a silica containing material that preferably forms a dense layer impermeable to water migration, for example, having pore channels less than about 5 Angstroms and preferably having a porosity of less than about 10%. Exemplary flowable dielectric material that may be used for the protective layers, include for example, spin on glass. Preferably, the flowable dielectric is sufficiently viscous to minimize flow of the flowable dielectric into the pore openings e.g., 41B to minimize the filling or partial filling of the pore openings during the process steps according to the present invention.

Figure 3B:
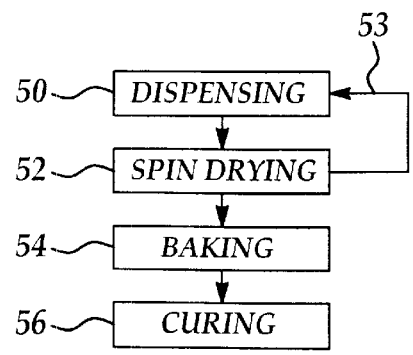
FIG. 3B is a process flow chart showing a process flow diagram for forming the multi-layer protective coating according to the present invention.

Referring to FIG. 3B, is shown a process flow chart according to an exemplary embodiment of the method according to the present invention to form a plurality of protective layers. In an initial step, a flowable dielectric is dispensed 50 according to a conventional spin coating technique, for example, using a cup dispenser to dispense from about 2 ml to about 4 ml onto a semiconductor process wafer surface including a porous low-k insulating layer surface. While dispensing the flowable dielectric, the process wafer is mounted on a conventional spin coating wafer chuck spinning the process wafer at a rate of from about 1000 to about 4000 rpm. It will be appreciated by those skilled in the art, that the spin rate of the process wafer is adjusted depending on the viscosity of the flowable dielectric material applied to the process wafer surface to achieve a uniform coating of material, the excess being discharged off the periphery of the process wafer. The dispensing step may optionally be carried out under controlled ambient conditions including a vacuum. Further, the process wafer may be baked to outgas any moisture absorbed into the porous low-k insulating layer or protective layers a point in the process prior to narrowing the communication channels to a degrees sufficient to block migration of water.

Following the dispensing step, the process wafer including a substantially uniform coating of flowable dielectric is subjected to a spin drying step 52, where the wafer spin rate is increased to about 2000 to about 4000 rpm for a period of time to allow the flowable dielectric to partially dry and to form at least a partially polymerized protective layer. The period of time of the spin drying step, as will be appreciated by those skilled in the art will partially depend on the initial viscosity and the rate of solvent evaporation from the flowable dielectric. Preferably, however, according to the present invention, the spin drying step is carried out for a sufficient period of time such that the applied protective layer of from about 100 Angstroms to about 500 Angstroms is sufficiently viscous to resist and minimize the flowable dielectric from filling or partially filling the pore openings. For example the spin drying step may from about 5 to about 10 minutes. The spin drying step may optionally be carried out under controlled ambient conditions including a vacuum.

Following the spin drying step 52 for applying a protective layer, the process may optionally proceed to a baking step 54, but preferably, the process cycles to the dispensing step 50 as shown by process arrow 53 for application of another protective layer. However, for example, if the plurality of layers necessary to adequately seal the pore openings to water migration exceeds about 5 layers or may tend to be insufficiently by the spin drying step 52, it may be optionally preferable to proceed to the baking step 54 to enhance further polymerization prior to applying more protective layers.

Following application of the plurality of protective layers such that communication channels less than about 5 Angstroms will be formed upon complete polymerization, the process proceeds to the baking step 54 where the process wafer including the plurality of protective layers is subjected to a baking process whereby any remaining solvent is evaporated and polymerization of the protective layers is enhanced. For example, the process wafer may be baked at from 50° C. to about 300° C. for a period of from about 1 minute to about 10 minutes. The baking step may optionally be carried out under controlled ambient conditions including a vacuum. It will be appreciated that the time period for the baking step will depend on the initial viscosity of the flowable dielectric, the solvent present, and the polymerization rate of the flowable dielectric. It will be further be appreciated that the baking step may include a series of baking steps at increasing temperatures such as a pre-programmed ramp and soak process.

Following the baking step 54, the process wafer including the plurality of protective layers is subjected to a curing step 56. The curing step is preferably carried out over a time period of from about 5 to about 16 minutes at a temperature of from about 200° C. to about 500° C. The proper time period for curing the flowable dielectric will again depend on the properties of the flowable dielectric. It will be appreciated that the baking step 56 may include a series of baking steps at increasing temperatures such as a pre-programmed ramp and soak process. Preferably, the plurality of protective layers are cured for a time period at a temperature such that any porosity included in the protective layers is less than about 5 Angstroms in diameter. It will further be appreciated that the curing step may take place under controlled ambient conditions including a vacuum.

Following, the application of the plurality of protective layers according to the present invention, the semiconductor process wafer may be subjected to well known processing conditions to complete the device feature manufacturing process including the formation of vias and trench lines in a multi-layer device as previously discussed.

According to the method of the present invention, a plurality of protective layers are applied to a low-k porous material such that communication channels formed in the protective layers in communication with the pore openings at the surface of the low-k porous material layer are progressively narrowed with minimal filling of the pore openings, thereby substantially blocking the migration of chemical species, including water. As such, the porosity of the low-k porous insulating layer is preserved, thereby also preserving the dielectric constant of the porous insulating layer. Additionally, the plurality of layers, forming an overall thickness of less than about 1000 Angstroms, and having a dielectric constant of less than about 3.9, minimizes the contribution to capacitance of the overall structure.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a multi-layer protective coating over a porous low-k (dielectric constant) material for use in a multiple layer semiconductor device comprising the steps of:

providing a semiconductor process wafer including a process surface; forming a low-k porous material layer over said process surface wherein said low-k porous material layer including a plurality of openings penetrating the process surface to form a plurality of pore openings; and forming a flowable dielectric onto the process surface to form a plurality of protective layers such that the porosity of the low-k porous material layer is substantially maintained and the plurality of protective layers are formed such that migration of water ($H_2O$) is substantially blocked through at least an uppermost protective layer surface.

2. The method of claim 1, wherein the step of forming a flowable dielectric further comprises the steps of:

forming an initial protective layer over the process surface to at least partially cover the plurality of pore openings thereby forming a corresponding narrowed communication channel to include a closed communication channel disposed substantially over each pore opening of the plurality of pore openings to form a plurality of communication channels; and forming at least one additional protective layer over the initial protective layer to at least narrow the plurality of communication channels to a diameter of less than about 5 Angstroms to include closing at least a portion of the plurality of communication channels.

3. The method of claim 1, wherein the low-k porous material layer includes interconnecting pores having a pore diameter of from about 10 Angstroms to about 500 Angstroms.

4. The method of claim 1, wherein the low-k porous material layer has a dielectric constant of less than about 3.0.

5. The method of claim 1, wherein the low-k porous material layer has a dielectric constant of less than about 2.0.

6. The method of claim 1, wherein the low-k porous material layer includes at least one of a porous silica, a mesoporous silicate, an aerogel, or a xerogel.

7. The method of claim 1, wherein the low-k porous material layer includes a mesoporous material with a dimensionally consistent pore structure.

8. The method of claim 1, wherein the flowable dielectric forms a silicon oxide containing material.

9. The method of claim 1, wherein the plurality of protective layers have a density of from about 2.2 to about 2.4 $gms/cm^3$.

10. The method of claim 1, wherein the plurality of protective layers are impermeable to water.

11. The method of claim 1, wherein the plurality of protective layers are formed having a total thickness of less than about 1000 Angstroms.

12. The method of claim 11, wherein each protective layer of the plurality of protective layers are formed having substantially the same thickness.

13. The method of claim 11, wherein each protective layer of the plurality of protective layers is formed having a sequentially decreasing thickness from an initial protective layer thickness.

14. The method of claim 1, wherein the step of spin coating further comprises the steps of:

dispensing a selectable amount of flowable dielectric onto the process wafer surface while spinning the process wafer to form a substantially uniform layer of the flowable dielectric;

spin drying the substantially uniform layer of flowable dielectric by spinning the process wafer for a period of time sufficient to form an at least partially polymerized protective layer over the process wafer surface including at least a portion of the pore openings;

repeating the dispensing and spin drying steps to form a plurality of the at least partially polymerized protective layers;

baking the plurality of the at least partially polymerized protective layers at a temperature for a period of time; and curing the plurality of the at least partially polymerized protective layers at a temperature for a period of time to form a plurality of substantially polymerized protective layers.

15. The method of claim 14, wherein the step of dispensing further comprises spinning the process wafer at a spin rate of from about 1000 to about 4000 rpm.

16. The method of claim 14, wherein the step of spin drying further comprises spinning the process wafer at a spin rate of from about 2000 to about 4000 rpm.

17. The method of claim 14, wherein the step of baking further comprises heating the process wafer at one or more temperatures ranging from about 50 to about 300 degrees Centigrade for a total heating period of from about 1 minute to about 10 minutes.

18. The method of claim 14, wherein the step of curing further comprises heating the process wafer at one or more temperatures ranging from about 200 to about 500 degrees Centigrade for a total heating period of from about 5 minutes to about 20 minutes.

19. The method of claim 14, wherein at least one of the steps of dispensing, baking and curing are selectively carried out under controlled ambient conditions including a pressure.

20. The method of claim 1, wherein an outgassing step is performed to outgas moisture from the low-k porous material layer prior to forming a protective layer included in the plurality of protective layers such that water ($H_2O$) is substantially blocked from migrating through the at least an uppermost protective sealing layer surface.

* * * * *